United States Patent
Frey

(10) Patent No.: US 6,768,686 B2
(45) Date of Patent: Jul. 27, 2004

(54) READ/WRITE AMPLIFIER FOR A DRAM MEMORY CELL, AND DRAM MEMORY

(75) Inventor: Alexander Frey, Munich (DE)

(73) Assignee: Infineon Technologies AG (DE)

(*) Notice: Subject to any disclaimer, the term of this patent is extended or adjusted under 35 U.S.C. 154(b) by 79 days.

(21) Appl. No.: 10/001,429

(22) Filed: Oct. 30, 2001

(65) Prior Publication Data

US 2002/0087782 A1 Jul. 4, 2002

(30) Foreign Application Priority Data

Mar. 13, 2000 (DE) .......................................... 100 12 106

(51) Int. Cl.$^7$ ................................................. G11C 7/00
(52) U.S. Cl. .................... 365/189.07; 365/205; 365/207
(58) Field of Search ........................... 365/189.07, 205, 365/207

(56) References Cited

U.S. PATENT DOCUMENTS

| 4,367,540 A | | 1/1983 | Shimohigashi |
| 4,916,667 A | | 4/1990 | Miyabayashi et al. |
| 5,016,224 A | * | 5/1991 | Tanaka et al. ......... 365/230.03 |
| 5,579,273 A | | 11/1996 | Childers et al. |
| 5,757,692 A | | 5/1998 | Suh |

FOREIGN PATENT DOCUMENTS

EP          0704847          4/1996

* cited by examiner

*Primary Examiner*—Huan Hoang
(74) *Attorney, Agent, or Firm*—Jeffrey R. Stone; Briggs and Morgan

(57) ABSTRACT

A description is given of a DRAM memory (10) having a number of DRAM memory cells (15) which each form one or more memory cell arrays (11). Each memory cell (15) is connected to a bit line (12) and a reference bit line (13), respectively. The individual bit lines (12; 13) are furthermore connected to at least one read/write amplifier (30) according to the invention. In order that the read/write amplifier circuit (30) can perform the tasks intended for it with high evaluation reliability and speed in conjunction with the smallest possible space requirement, the invention specifies a space-saving sense amplifier scheme in which the read/write amplifier (30) has a first read/write amplifier element (40) and a second read/write amplifier element (50) separate therefrom, the individual amplifier components (41, 42, 43, 51, 54) being divided between the two read/write amplifier elements (40, 50). As a result, a single read/write amplifier (30) can be used simultaneously to evaluate a plurality of bit line pairs (16) in a single member cell array (11).

19 Claims, 7 Drawing Sheets

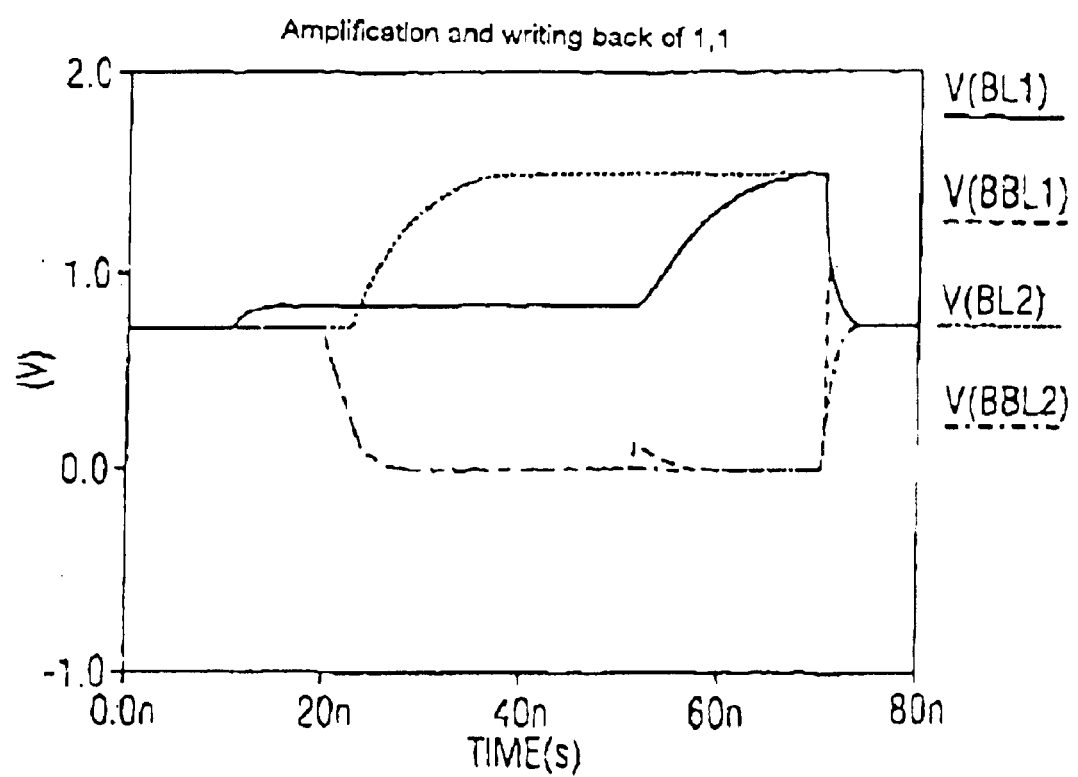

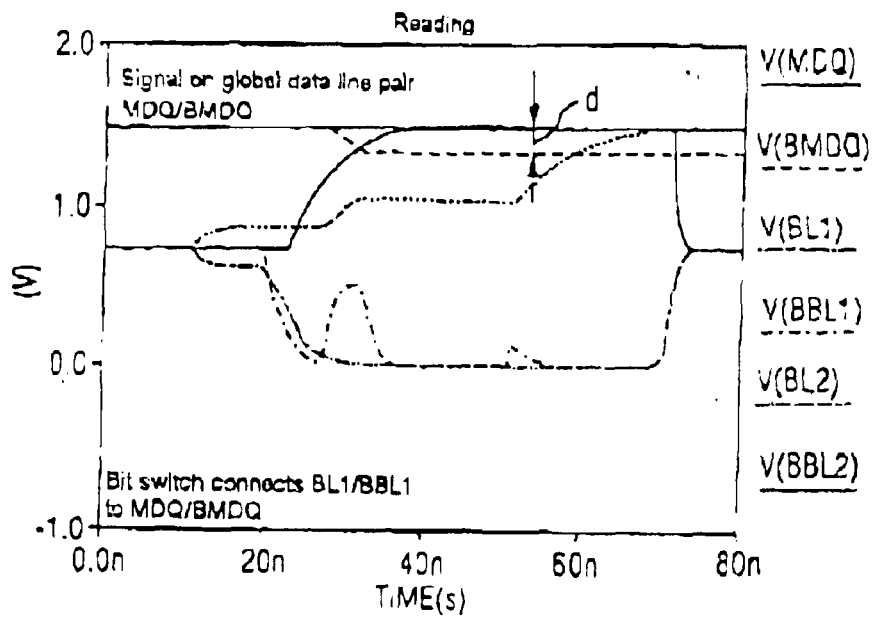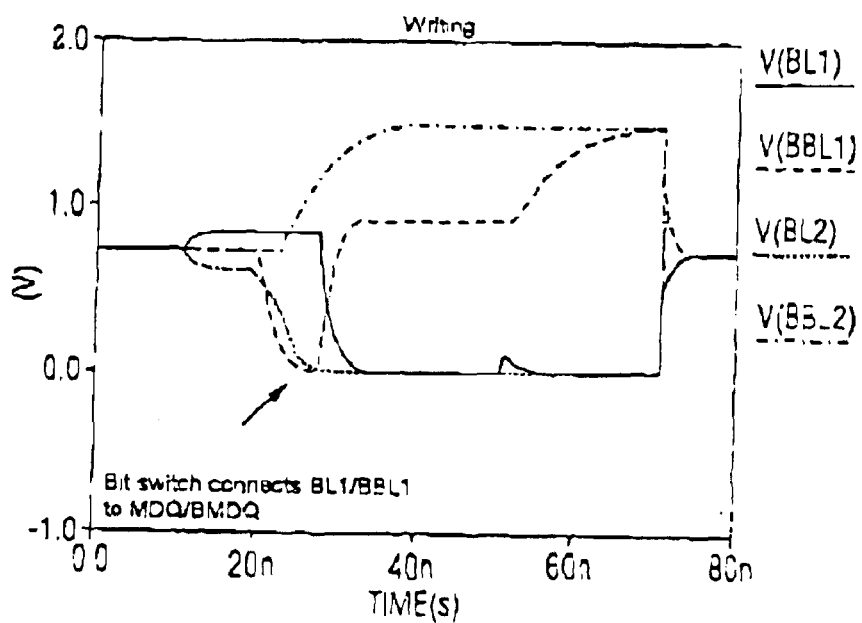

READ/WRITE AMPLIFIER FOR A DRAM MEMORY CELL, AND DRAM MEMORY

The present invention relates firstly to a read/write amplifier for a DRAM memory cell in accordance with claim 1. Furthermore, the invention relates to a DRAM memory in accordance with claim 10. Finally, the invention also relates to a method for evaluating DRAM memory cells of a DRAM memory.

DRAM memory cells (Dynamic Random Access Memory cells) and memories represent an important type of memory for storing digital information. A DRAM is a memory in which, after specification of an address, data can be stored and read out again under this address. In DRAM memory cells and memories, respectively, the information is not stored as a switching state of a circuit but rather as a quantity of charge on a capacitance. Consequently, such a memory cell can be formed with only a storage capacitor and a selection transistor. Since every capacitor has leakage currents and leakage currents also flow via the selection transistor, the information in the DRAM memory cell is continuously degraded. The information content of the memory cell is therefore lost over time. In order to avoid this, the contents of the memory cells are periodically read out, the memory contents are evaluated and the memory cell is written to anew. This means that the charge contents of the storage capacitors are refreshed again, which is referred to as "refresh".

DRAM memory cells are usually interconnected to form memory cell arrays, a DRAM memory having one or a plurality of such memory cell arrays. Each memory cell is connected, or wired, to the cell periphery via at least one word line and a bit line, the word line(s) and the bit line being routed via the memory cell and being oriented at least substantially perpendicularly to one another. Through activation of a specific word line, all the memory cells connected thereto can, via their bit lines, be read, written to or refreshed with regard to their information content.

In DRAM memory cells, digital information items can be stored for example in the form of logic "0" and "1". Each of these logic information items is assigned a specific voltage value. By way of example, the voltage value for logic "0" may be zero volts, while the voltage value for logic "1" is 2 volts, for example. Before the memory cells are read, a reference voltage, for example a voltage of 1 volt is applied to all the bit lines. During the reading of the memory cell, the voltage value will either increase somewhat or else decrease, depending on the information content of the memory cell. This voltage change is compared with a reference voltage prevailing on a reference bit line. In this case, the reference bit line is connected to a memory cell which is currently not being evaluated. If the voltage value on the bit line that is to be evaluated is higher than the reference voltage, the information content logic "1" had been written to the memory cell. In the case of smaller voltage values, the information logic "0" had been written to the memory cell. The voltage signal read from the bit line to be evaluated and the reference bit line is conditioned and processed further, for example amplified, in a read/write amplifier.

Depending on the memory architecture, the bit lines (BL) of the memory cells to be evaluated and the respective reference bit lines (BBL) may be arranged beside one another in one and the same memory cell array and thus form a bit line pair in each case. In other memory architectures, the reference bit lines are each situated in a different memory cell array.

As has already been mentioned, the logic information items "0" and "1" are stored in the form of charge in cell capacitances in the case of a DRAM memory. These charges are converted into a small voltage signal in a first section of the evaluation. The read/write amplifier circuit of a DRAM memory has the task of amplifying this voltage signal to a full level. The amplified signal serves, on the one hand, for writing back the information that was destroyed in the memory cell during read-out, and, on the other hand, for forwarding the information read to the DRAM periphery. The read/write amplifier circuit must perform the aforementioned tasks with high evaluation reliability and speed in conjunction with the smallest possible space requirement.

Conventional read/write amplifier circuits generally comprise a number of components for assessing, amplifying and forwarding voltage signals read from the bit lines and reference bit lines.

These components include, for example, at least one "N latch circuit" (NL), which serves for producing the low level for the voltage value. The N latch circuit has the task of amplifying a voltage signal to this low level. With reference to the numerical example mentioned further above the low level might be, for example, the "0" volts value.

Furthermore, the read/write amplifier may have at least one "P latch circuit" (PL), which serves for producing a high level. Thus, the P latch circuit serves for amplifying a voltage signal to this high level, which corresponds to the "2" volts value, for example, in connection with the numerical example mentioned above.

A further component for the read/write amplifier is, for example, the "equalizer" (EQ), which serves for producing a reference voltage value (precharge level) on the bit lines.

Furthermore, the read/write amplifier may have at least one "bit switch" (BS), which is used for connecting a bit line pair—selected for example by a "column address"—to external data lines.

Finally, the read/write amplifier may have one or more transistors for changing over between different bit lines. Such transistors are, for example, selection transistors (MUX) for multiplexing the read/write amplifiers between different bit line pairs.

The individual components of the read/write amplifier will be explained in more detail in the further course of the description.

FIG. 1 diagrammatically illustrates a DRAM memory which is known from the prior art and in which different read/write amplifier circuits (SA) are utilized for bit line pairs of adjacent memory cell arrays (Arrays). Such read/write amplifier circuits are also referred to as "shared sense amplifier". An arrangement of the different read/write amplifier circuits as illustrated in FIG. 1 already leads to a favorable ratio of the area proportions of memory cells and read/write amplifier circuits.

Depending on the DRAM memory type, the area required by the read/write amplifier circuit(s) can vary greatly in relation to the total area of the memory. The absolute area of a read/write amplifier circuit usually remains the same, so that the relative size of the read/write amplifier circuit in the overall memory changes depending on the memory architecture. In this case, the relative size of the read/write amplifier circuits in a DRAM memory may be between 5% and 30% of the total memory area. There is, therefore, a need to minimize the required area of the read/write amplifier circuits as well as possible.

In a known DRAM memory, with the aid of a second metal plane in the integrated circuit per memory cell array, it is possible to evaluate an additional bit line pair with each read/write amplifier circuit. This architecture thus halves the required number of read/write amplifier circuits in comparison with a conventional memory architecture as described above. However, the use of two metal planes is very cost-intensive and hence disadvantageous.

Another approach which is known from the prior art and serves for saving read/write amplifier area consists in the multiple use of the same read/write amplifier for different bit line pairs by multiplexing. Such an approach is illustrated for example in FIG. 2 and is explained in more detail in the context of the description of the figures. This known principle is based on the multiple utilization of read/write amplifier circuits for bit line pairs in the same memory cell array. The read/write amplifier (SA) is connected by selection transistors (MUX) to respectively complementary halves of bit line pairs of a cell array. The connected bit line pairs can be evaluated in a customary manner. An unamplified voltage signal develops on the unconnected bit line pairs. The voltage signal must remain undisturbed until the read/write amplifier circuit is changed over to the corresponding bit lines. The signal amplification and the writing back to the memory cells can then take place. During this second phase, the amplified voltage levels must remain on the bit lines evaluated in the first step. If the aforementioned preconditions are met, then at the end of the second phase the read-out information items of the entire cell array are written back and the word line can be deactivated.

One disadvantage of this solution approach, however, resides in the expected high degree of interference with the voltage signal on the unconnected bit lines as a result of capacitive overcoupling of the voltage changes on the adjacent bit lines which are connected to the read/write amplifier circuits. This interference can become so great that the voltage changes caused thereby no longer permit error-free evaluation of the memory cells.

Furthermore U.S. Pat. No. 4,916,667 discloses a DRAM memory in which an equalize component is assigned to a first bit line pair and the bit switch component is assigned to a second bit line pair, in which case the first bit line pair and the second bit line pair can be interconnected.

U.S. Pat. No. 5,757,692 describes a further semiconductor memory.

Taking the abovementioned prior art as a departure point, the present invention is based on the object of providing a read/write amplifier, a DRAM memory and also a method for evaluating DRAM memory cells of a DRAM memory with which the abovementioned disadvantages are avoided. In particular, the intention is that the read/write amplifier circuit can perform the tasks intended for it with high evaluation reliability and speed in conjunction with the smallest possible space requirement.

This object is achieved by means of the read/write amplifier for a DRAM memory cell in accordance with patent claim 1, the DRAM memory in accordance with patent claim 10 and also the method for evaluating DRAM memory cells of a DRAM memory in accordance with patent claim 15. Further, advantageous features, aspects and details of the invention emerge from the dependent claims, the description and the drawings. Advantages and features which are described with regard to the read/write amplifier likewise apply to the DRAM memory and also the method. Advantages and features which are described with regard to the DRAM memory likewise apply to the read/write amplifier according to the invention and also the method according to the invention. The same applies analogously to the method according to the invention.

The first aspect of the present invention provides a read/write amplifier for a DRAM memory cell, which, for evaluation of the information content of at least one DRAM memory cell, is connected or can be connected to at least one bit line and to at least one reference bit line, which in each case form a bit line pair. The read/write amplifier has a number of components for assessment, amplification and forwarding of voltage signals read from the bit lines and reference bit lines. According to the invention, this read/write amplifier is characterized in that it has a first read/write amplifier element and a second read/write amplifier element separate therefrom, and in that the individual amplifier components are divided between the two read/write amplifier elements.

This produces an area-optimized DRAM read/write amplifier circuit which has only a small space requirement and with which the evaluation of DRAM memory cells, in particular of memory cells of a single memory cell array, can be evaluated with high reliability and speed.

The read/write amplifier according to the invention makes it possible to avoid the problems outlined with respect to the prior art on account of the fact that the individual components of the read/write amplifier can be used for a plurality of bit line pairs in a memory cell array and with simultaneous direct amplification of all the signals being made possible.

A basic concept of the present invention is that the individual components of the read/write amplifier circuit are now divided between two read/write amplifier elements. These two read/write amplifier elements are embodied separately from one another. The first read/write amplifier element (SAINT) serves primarily for writing back cell information items, while the second read/write amplifier element (SAEX) can additionally drive the information item read out, or the datum read out, into an external area of the DRAM memory and enables the writing of cell information items.

Since a plurality of bit lines, or bit line pairs, can now be evaluated by one and the same read/write amplifier which has merely been divided between two amplifier elements, the requisite space requirement for the read/write amplifier circuits in the entire DRAM memory can be considerably reduced.

In the light of the present invention, evaluation of a memory cell is understood to be not only the reading of information items from a memory cell but also the forwarding of the information and also the subsequent writing back of the cell information at the end of the evaluation operation.

For the mode of operation of the read/write amplifier according to the invention, reference is likewise made to the explanations regarding the method according to the invention.

The amplifier components may advantageously have at least one N latch circuit for amplifying a voltage signal to a low level and/or at least one P latch circuit for amplifying a voltage signal to a high level and/or at least one equalizer for producing a reference voltage value on the bit line(s) and the reference bit line(s) and/or at least one bit switch for connecting at least one selected bit line pair to at least one external data line.

Preferably, at least one N latch circuit and at least one P latch circuit may be provided in the first read/write amplifier element.

Furthermore, the first read/write amplifier element may be provided with at least one equalizer. The function of the equalizer is to set the voltage signals amplified to low levels and/or high levels after the evaluation operation once again to the reference voltage value.

At least one N latch circuit may advantageously be provided in the second read/write amplifier element.

Furthermore, at least one bit switch may be provided in the second read/write amplifier element. If only the second read/write amplifier element is provided with a bit switch, in each case only half of the memory cells activated by a word line can potentially be read or written to anew. In this case, the bit switch has the following basic function. If a specific memory cell is intended to be read, the entire page, that is to say the quantity of all the memory cells which are connected to a word line, is addressed in which said memory cell is situated. This means that the information items of the entire page are read out. By means of activation of the bit switch, that/those memory cell(s) whose information content is actually of interest can now be selected from the entire quantity of the memory cells read.

In a further refinement, it is possible that the second read/write amplifier element is connected or can be connected to at least one external data line. These external data lines lead from the evaluated DRAM memory cell, or the memory cell array, through to the DRAM memory periphery.

It is advantageously possible that the second read/write amplifier element is connected or can be connected to at least one further read/write amplifier. This additional read/write amplifier, also called "Secondary Sense Amplifier (SSA)" can further amplify the voltage signals that have been read from the read/write amplifier assigned to the DRAM memory and have been correspondingly amplified, with the result that these voltage signals can also be utilized further outside the DRAM memory.

The first and/or the second read/write amplifier element may have one or more transistors for changing over between different bit lines and reference bit lines, respectively. These transistors, which, for example, are also called selection transistors or multiplex transistors, determine which bit line pair is actively connected to the first and/or second read/write amplifier element.

A second aspect of the present invention provides a DRAM memory, having a number of DRAM memory cells, which each form one or more memory cell arrays, each memory cell being connected to a bit line and the bit lines furthermore being connected to at least one read/write amplifier. The invention provides for the at least one read/write amplifier to be designed as a read/write amplifier according to the invention as described above.

A DRAM memory according to the invention, designed in this way, makes it possible for the individual memory cells to be evaluated with high evaluation reliability and speed in conjunction with a very small space requirement of the read/write amplifier circuits and hence of the DRAM memory. For the mode of operation of the DRAM memory according to the invention, reference is likewise made to the explanations concerning the method according to the invention.

At least one word line may advantageously be provided, which is routed across the memory cell array(s) of the DRAM memory and, for activation of the DRAM memory cells, is connected to one or more memory cell(s). In this case, the at least one physical word line can be divided by the selection transistors into two logical word lines. The cell signals of one word line half are amplified by the first read/write amplifier element, while the cell signals of the other word line half are amplified by the second read/write amplifier element.

Preferably, a plurality of bit lines of a memory cell array are connected to the read/write amplifier.

In each case a bit line of a DRAM memory cell that is to be evaluated and a reference bit line of a DRAM memory cell that is not to be evaluated may form a bit line pair, each bit line pair being connected both to the first and to the second read/write amplifier element.

It may be the case here that the connection of a bit line and/or reference bit line to the read/write amplifier is activated or can be activated preferably via one or more transistors.

A third aspect of the present invention provides a method for evaluating DRAM memory cells of a DRAM memory, in particular of a DRAM memory according to the invention as described above, and in particular using a read/write amplifier according to the invention as described above, which method has the following steps.

Firstly, one or a plurality of memory cell(s) to be evaluated is/are activated via at least one word line. If a plurality of memory cells are intended to be evaluated, they are preferably situated within a single memory cell array. The memory cells connected to the word line can be read through the activation of said word line.

Afterward, the connection of at least one first bit line pair, formed from a bit line of the memory cell that is to be evaluated and a reference bit line of a memory cell that is not to be evaluated, to a first read/write amplifier element is activated and, at the same time, the connection of at least one second bit line pair, adjacent to the first bit line pair, to a second read/write amplifier element is activated, the two bit line pairs in each case being connected to the first and second read/write amplifier elements.

If the read/write amplifier is connected for example to two bit line pairs, that is to say each of the two read/write amplifier elements is in each case connected to both bit line pairs, the transistors may initially be switched in such a way that one of the two bit line pairs is actively coupled to the first read/write amplifier element, while the other bit line pair is actively coupled to the second read/write amplifier element.

The voltage signals read out via the first bit line pair are subsequently amplified by means of at least one N latch circuit provided in the first read/write amplifier element and also a P latch circuit. At the same time, the voltage signals read out via the second bit line pair are amplified by means of at least one N latch circuit provided in the second read/write amplifier element. This is done, for example, as follows.

At the beginning of the evaluation, a reference voltage is applied preferably to all of the bit lines. If the cells to be read are activated, the voltage value present on the bit line to be evaluated changes as a result of the activation. By way of example, the voltage value rises slightly in the case of an information item of logic "1" situated in the memory cell whereas it falls slightly in the case of a logic information item "0" stored in the memory cell. In the case of the unactivated reference bit line, however, the voltage value remains substantially constant. By comparison between the bit line (BL) and the reference bit line (BBL), it is now possible to see what information had been stored in the memory cell, depending on whether the voltage value read out lies above or below the reference voltage value.

The cell signals of the memory cells connected to the second read/write amplifier element, or the voltage values read out via the corresponding bit lines, are initially amplified only by means of an N latch circuit. If an information item logic "0" had been stored in the memory cell to be evaluated, this means that the voltage value present on the bit line to be read at the beginning of the evaluation is less than the reference voltage value on the reference bit line. The N latch circuit amplifies to the low level the voltage values of those bit lines which have a lower voltage value. In this case, this means that the memory cell having the information item logic "0" is amplified down to the low level. The voltage signal of the reference bit line initially remains substantially unchanged, or falls significantly less than the voltage signal of the bit line.

If an information item logic "1" had been situated in the memory cell to be evaluated, this would have led to a slight voltage increase relative to the reference voltage value. The N latch circuit would once again have amplified the lower of the two voltage values down to a low level. In this case, this would have been the voltage value on the reference bit line. From the substantially unchanging voltage value, or voltage value falling to a significantly lesser degree, of the bit line to be evaluated, it would then have been possible to infer that the information content stored in the memory cell to be evaluated is logic "1".

Also by using only a single N latch circuit in the second read/write amplifier element, it is possible, during the first amplification step, to state exactly what kind of information item had been stored, or is stored, in the memory cells. If the voltage value on the bit line to be evaluated is pulled down to a low level, it is known that the information in the memory cell was logic "0". However, if the voltage value of the reference bit line is pulled down to a low level, it is known that the information in the memory cell was logic "1".

At the same time as the amplification in the second read/write amplifier element, the memory cells connected to the first read/write amplifier element are also evaluated. In addition to the N latch circuit, however, the first read/write amplifier element also has a further P latch circuit. As has been described above with regard to the second read/write amplifier element, the respective lower voltages in a bit line pair are amplified to the low level. The respective other cell signals, that is to say the higher voltage signals, are amplified to the full high level by means of the P latch circuit. This means that if the voltage value on the bit line of the memory cell to be evaluated has been amplified down to a low level, the voltage value present on the reference bit line is amplified to the high level.

In principle, voltage signals amplified to both levels are required in order to be able subsequently to write back to the memory cells. This means that the voltage values initially not amplified to high levels in the second read/write amplifier element also still have to be amplified in a corresponding manner.

After the voltage signals have been amplified in the above way, the data of the memory cell(s) that is/are to be evaluated and is/are actively connected to the first read/write amplifier element are evaluated and subsequently written back. After the writing back of the data by the first read/write amplifier element, the corresponding bit line pairs can be disconnected by the selection transistors, with the result that they float at full voltage levels.

The connection between the bit line pairs and the first read/write amplifier element is subsequently changed over in such a way that the P latch circuit of the first read/write amplifier element is now changed over to the second read/write amplifier element.

The N latch circuit of the first read/write amplifier element is then switched off, while the still active P latch circuit is coupled to the bit line pair connected to the second read/write amplifier element. As a result, the voltages of the bit line pair that have hitherto not been amplified to high levels can be amplified to a full level. In this case, the N latch circuit of the second read/write amplifier element is likewise held active.

The data of the memory cell(s) that is/are to be evaluated and is/are actively connected to the second read/write amplifier element are subsequently evaluated and written back.

Afterward, in order to end the evaluation method, the memory cells that are to be evaluated can be deactivated.

There is no loss of time caused by the successive amplification to the high level of the individual bit line pairs by only a single P latch circuit, since the cell information items can already be output to the outside via the second read/write amplifier element before both levels, that is to say the low level and also the high level, are fully installed.

Before the evaluation of the memory cells, a uniform reference voltage can be applied to all the bit lines of the memory cells provided in one or more memory cell arrays. The generation and the function of such a reference voltage have been thoroughly explained further above.

Preferably, after the activation of a bit switch provided in the second read/write amplifier element, a voltage difference can be generated on one or more external data line(s) connected to said bit switch.

This voltage difference can then be evaluated by a further, external read/write amplifier.

After the end of the evaluation operation, the uniform reference voltage may advantageously be applied to all the bit lines of the evaluated memory cells via an equalizer.

The invention will now be explained in more detail using exemplary embodiments with reference to the accompanying drawing, in which:

FIGS. 5a to 5c show voltage profiles for the internal read-out and writing back of different cell information items to memory cells connected by an active word line and two bit lines; and FIGS. 6a and 6b show voltage profiles for the external reading and writing of cell information items of a memory cell connected to a bit line.

Figure 1:
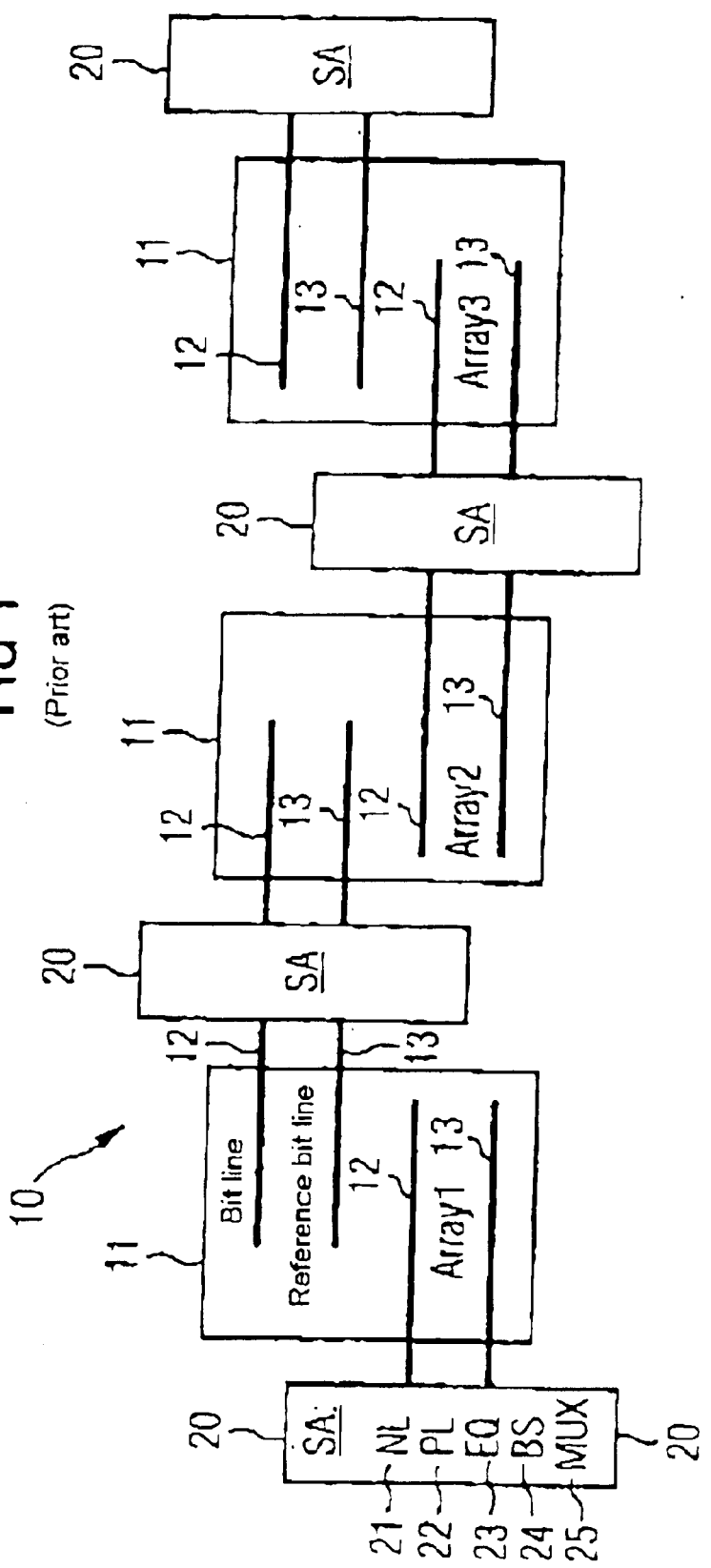
FIG. 1 shows a circuit arrangement of a DRAM memory known from the prior art.

FIG. 1 illustrates a DRAM memory 10 which is known from the prior art and has a number of memory cell arrays 11. Three such memory cell arrays 11 (Arrays 1 to 3) are illustrated in the present exemplary embodiment. Each memory cell array 11 is provided with a number of DRAM memory cells. Each DRAM memory cell is connected to a read/write amplifier (SA) 20 via a bit line 12. Each of the read/write amplifiers 20 is furthermore connected to a reference bit line 13.

As can be seen from FIG. 1, a read/write amplifier circuit 20 is used in each case for bit line pairs 12, 13 of adjacent cell arrays 11, thereby already obtaining a favorable ratio of the area proportions of memory cells and read/write amplifier circuits 20.

Each of the read/write amplifiers 20 is provided with a number of amplifier components. These amplifier components are, for example, an N latch circuit (NL) 21 for amplifying a voltage signal to a low level, a P latch circuit (PL) 22 for amplifying a voltage signal to a high level, an equalizer (EQ) 23 for producing a reference voltage value on the bit line(s) 12 and the reference bit line(s) 13, and also a bit switch (BS) 24 for connecting at least one selected bit line pair 12, 13 to at least one external data line. In order to be able to change over between different bit lines 12 and reference bit lines 13, respectively, one or more selection transistors (MUX) are furthermore provided per read/write amplifier 20.

In the DRAM memory cells, digital information items can be stored for example in the form of logic "0" and "1". Each of these logic information items is assigned a specific voltage value. By way of example, the voltage value for logic "0" may be zero volts, while the voltage value for logic "1" is 2 volts, for example. Before the memory cell is read, a reference voltage, for example a voltage of 1 volt, is applied to all the bit lines 12 and reference bit lines 13. During the reading of the memory cell, the voltage value on the corresponding bit line 12 will either increase somewhat or else decrease somewhat, depending on the information content of the memory cell. This voltage change is compared with the unchanged reference voltage still prevailing on the reference bit line 13. If the voltage value on the bit line 12 that is to be evaluated is higher than on the reference bit line 13, the information content logic "1" had been written to the memory cell. In the case of smaller voltage values, the information item logic "0" had been written to the memory cell. The voltage signals read from the bit line 12 to be evaluated and the reference bit line 13 are conditioned and amplified by the read/write amplifier 20.

Figure 2:
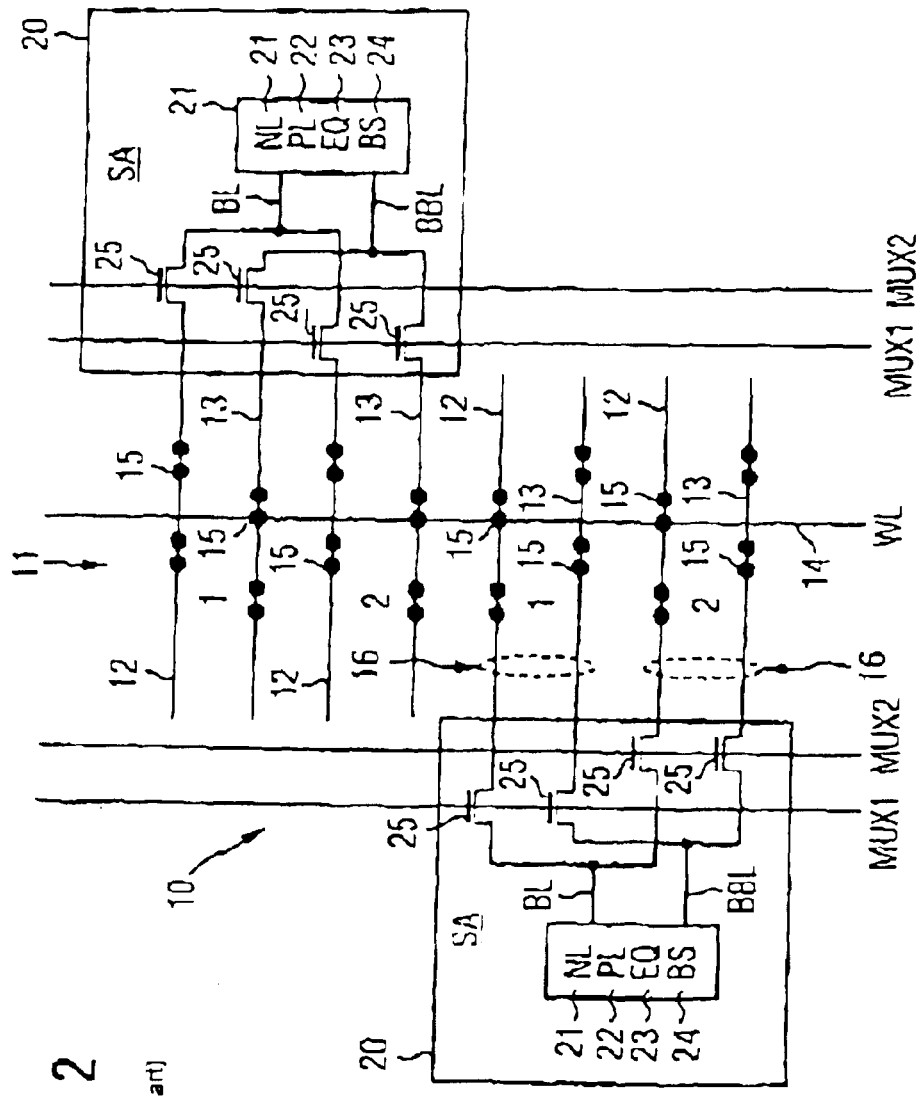
FIG. 2 shows a circuit arrangement of a further DRAM memory known from the prior art.

The DRAM memory 10 illustrated in FIG. 2 is likewise a memory architecture known from the prior art. The DRAM memory 10 is provided with one or more memory cell array(s) 11, in which a number of DRAM memory elements 15 are provided. For the sake of better clarity, only a single memory cell array 11 is illustrated in FIG. 2. The individual memory cells 15 are represented by large black dots. In order to be able to activate the individual memory cells 15 a word line 14 is provided, which is connected to a plurality of memory cells 15. All the memory cells 15 connected to the word line 14 are activated by means of activation of said word line.

Furthermore a number of bit lines 12 and reference bit lines 13 are provided in each case, a bit line 12 and a reference bit line 13 adjacent thereto in each case forming a bit line pair 16. The association of a bit line 12 and a reference bit line 13 as bit line pair 16 is symbolized in FIG. 2 by a circle surrounding the two bit lines 12, 13.

The DRAM memory 10 in accordance with FIG. 2 has two read/write amplifiers 20, where each read/write amplifier 20 can be used for different bit line pairs 16 within the same memory cell array 11. Each read/write amplifier 20 once again has an N latch circuit 21, a P latch circuit 22, an equalizer 23 and also a bit switch 24.

The read/write amplifiers 20 are connected via selection transistors (MUX1, MUX2) 25 to respectively complementary halves of bit line pairs 16 of a memory cell array 11. The connected bit line pairs 16 can be evaluated in a customary manner. The unamplified voltage signal develops on the unconnected bit line pairs 16. The voltage signal must remain undisturbed until the read/write amplifiers 20 are changed over to the corresponding bit lines 12, 13 by means of corresponding driving of the transistors 25. The signal amplification and also the writing back to the memory cells 15 can then take place. During this second phase, the amplified voltage levels must remain on the bit lines 12 evaluated in the first step.

As was explained in the context of the introduction to the description, such a configuration of the DRAM memory 10 has considerable disadvantages, however, since the voltage signals on the unconnected bit lines 12, 13 are disturbed by capacitive overcoupling of the voltage changes on the adjacent bit lines 12, 13 which are connected to the read/write amplifiers 20.

A read/write amplifier circuit 20 according to the invention, which enables DRAM memory cells to be evaluated with high evaluation reliability and speed and which has only a small space requirement, is illustrated in connection with FIG. 3.

Figure 3:
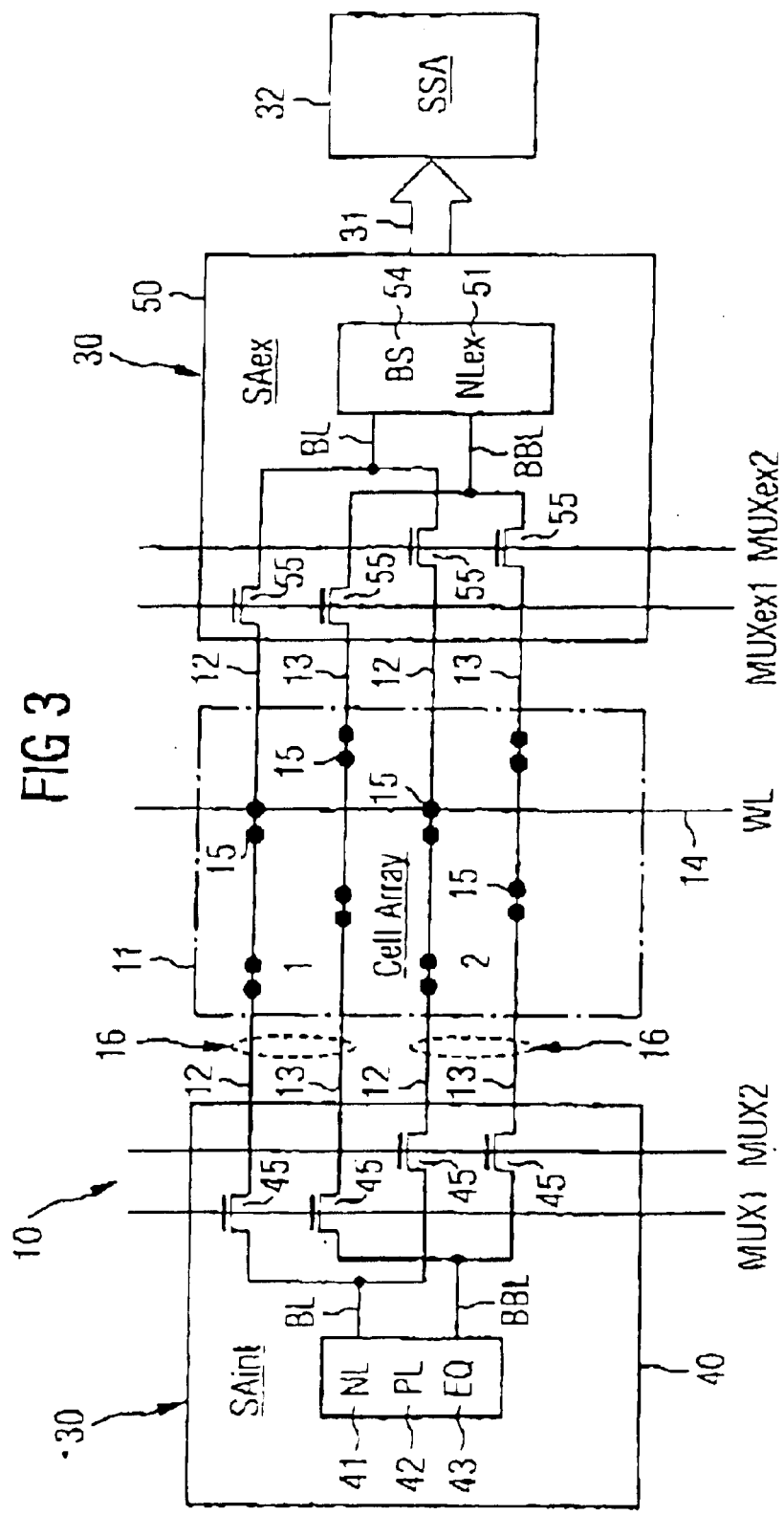
FIG. 3 shows a circuit arrangement of a DRAM memory according to the present invention.

FIG. 3 illustrates a DRAM memory 10 having one or more memory cell array(s) 11 having a number of DRAM memory cells 15, some of the memory cells 15 once again being represented as thick black dots and, for the sake of better clarity, only a single memory cell array 11 being shown. The memory cells 15 of the memory cell array (Cell Array) 11 are connected to a read/write amplifier 30 via bit lines 12 and reference bit lines 13, respectively.

According to the invention, the read/write amplifier 30 has a first read/write amplifier element 40 and a second read/write amplifier element 50 separate therefrom. The individual amplifier components are divided between the two read/write amplifier elements 40, 50.

The first read/write amplifier element (SAINT) 40 is provided with an N latch circuit (NL) 41, a P latch circuit (PL) 42 and also an equalizer (EQ) 43. The individual amplifier components are connected via selection transistors (MUX1, MUX2) 45 to bit lines (BL) 12 of memory cells 15 that are to be evaluated and also reference bit lines (BBL) 13 of memory cells 15 that are in each case not to be evaluated. A bit line 12 and a reference bit line 13 in each case form a bit line pair 16, which is once again symbolized by a circle surrounding the corresponding bit lines. It is possible to switch back and forth between different bit lines 12 and reference bit lines 13, respectively, by means of corresponding driving of the selection transistors 45.

The individual bit lines 12 and reference bit lines 13 are likewise connected to the second read/write amplifier element 50. The latter has an N latch circuit (NLEX) 51 and also a bit switch (BS) 54. The individual amplifier components are connected via corresponding selection transistors (MUXEX1, MUXEX2) to the bit lines 12 and reference bit lines 13, respectively, with the result that it is possible to switch back and forth between individual bit lines 12 and, respectively, reference bit lines 13 (and hence bit line pairs 16) by means of corresponding driving.

The second read/write amplifier element 50 is connected via at least one external data line 31 to a second read/write amplifier (SSA) 32, which is an external read/write amplifier.

For the activation of the memory cells 15, the latter are connected to a corresponding word line (WL) 14.

The mode of operation of such a DRAM memory 10 is now described below.

In the exemplary embodiment illustrated in FIG. 3, the read/write amplifier element 40 serves primarily for writing back the cell information, while the read/write amplifier element 50 can additionally drive the information read to the further read/write amplifier 32 and enables the writing of cell information items.

At the beginning of the evaluation operation, the word line 14 is activated, as a result of which the memory cells 15 connected to it can be read. The selection transistors 45, 55 are initially switched in such a way that the selection transistor MUX 2 is switched on and the selection transistor MUXEX2 is switched off (open), with the result that the bit line pair 16 (the lower two bit lines 12, 13) designated by "2" is coupled to the first read/write amplifier element 40. Likewise, the selection transistor MUX1 is switched off (open) and the selection transistor MUXEX1 is switched on, with the result that the upper bit line pair 16 (the upper two bit lines 12, 13) designated by "1" is coupled to the second read/write amplifier element 50.

The individual cell signals are initially amplified via the bit lines 12, 13 by the second read/write amplifier element 50 by means of the N latch circuit 51. As has been thoroughly explained in the context of the general description, this means that the voltage level of that bit line 12 or 13 of a bit line pair which is lower by comparison of the two voltage values is amplified down to the low level. This is because a uniform reference voltage was applied to all the bit lines 12, 13 before the beginning of the evaluation method.

The application of a uniform reference voltage value is effected via the equalizer 43.

If the memory cells 15 to be read are activated, the voltage value on the bit line 12 changes as a result of this activation. The voltage value increases slightly, for example, in the case of an information item logic "1" stored in the memory cell 15, whereas the voltage value decreases slightly, for example, in the case of an information item logic "0". In the case of the unactivated bit line, that is to say the reference bit line 13, however, the voltage value remains substantially unchanged.

The N latch circuit 51 always amplifies down to a low level that voltage value in a bit line pair 16 which has the lower value in each case. If the voltage value present on the bit line 12 is amplified down to a low level, this means that the information in the memory cell 15 to be evaluated was logic "0". If the voltage value on the reference bit line 13 is amplified down to a low level, this means that the information content in the memory cell 15 to be evaluated was logic "1".

The cell signals are also amplified by the first read/write amplifier element 40 at the same time as the second read/write amplifier element 50. In this case, the lower voltages are amplified to the low level by means of the N latch circuit 41, while the respective other cell signals are amplified to the full high level by means of the P latch circuit 42. By way of example, if the voltage signal of the bit line 12 to be evaluated was pulled to a low level, the voltage value of the reference bit line 13 is amplified to a high level, or vice versa.

After the writing back of the information items by the first read/write amplifier element 40, the bit line pairs 16 are disconnected by the selection transistors MUX1 or MUX2, with the result that they float at full voltage levels. The N latch circuit 41 of the first read/write amplifier element 30 is then switched off, while the still active P latch circuit 42 is changed over to the bit line pair 16, connected to the second read/write amplifier element 50, by means of corresponding driving of the selection transistors MUX1 or MUX2. The N latch circuit 51 of the second read/write amplifier element 50 is held active in this case. The voltages of the bit line pair 16 that have hitherto not been amplified can be amplified to full levels, that is to say to high levels, and written back to the memory cells 15.

Figure 4:
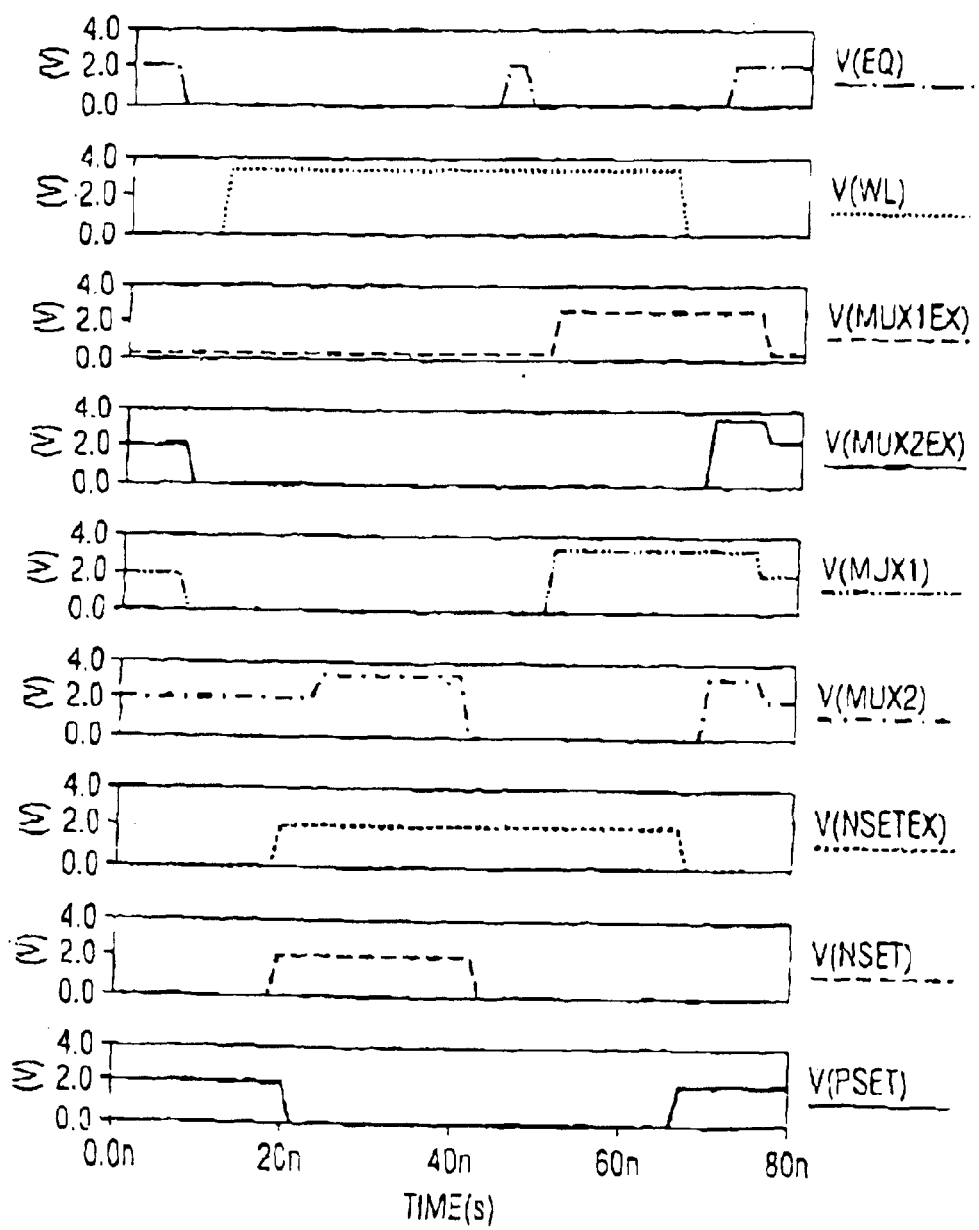
FIG. 4 shows the signal sequence of the read/write amplifier driving of a read/write amplifier according to the invention.

The requisite signal sequence of the sense amplifier driving is summarized in FIG. 4. In this case V(EQ) denotes the voltage profile in the equalizer 43, V(WL) denotes the voltage profile in the word line 14, V(MUX1EX) denotes the voltage profile in one of the selection transistors 55, V(MUX2EX) denotes the voltage profile of another selection transistor 55, V(MUX1) denotes the voltage profile of one selection transistor 45, V(MUX2) denotes the voltage profile of another selection transistor 45, V(NSETEX) denotes the voltage profile at the N latch circuit 51, V(NSET) denotes the voltage profile at the N latch circuit 41, and V(PSET) denotes the voltage profile at the P latch circuit 42.

Through activation of the bit switch 54, a voltage difference is generated on external data lines 31, which voltage difference can then be evaluated by the further read/write amplifier 32 and be amplified in a suitable manner for further process steps.

The word line 14 is deactivated after the end of the evaluation. By means of the equalizer 43, a uniform reference voltage is once again set on all the bit lines 12 and reference bit lines 13.

Figure 5A:
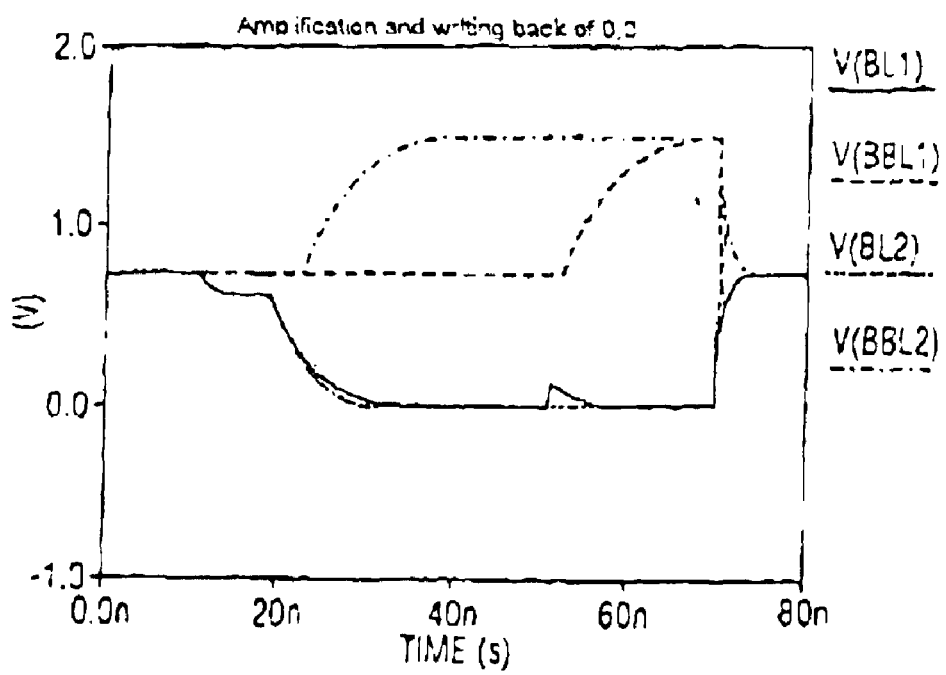
Figure 5B:
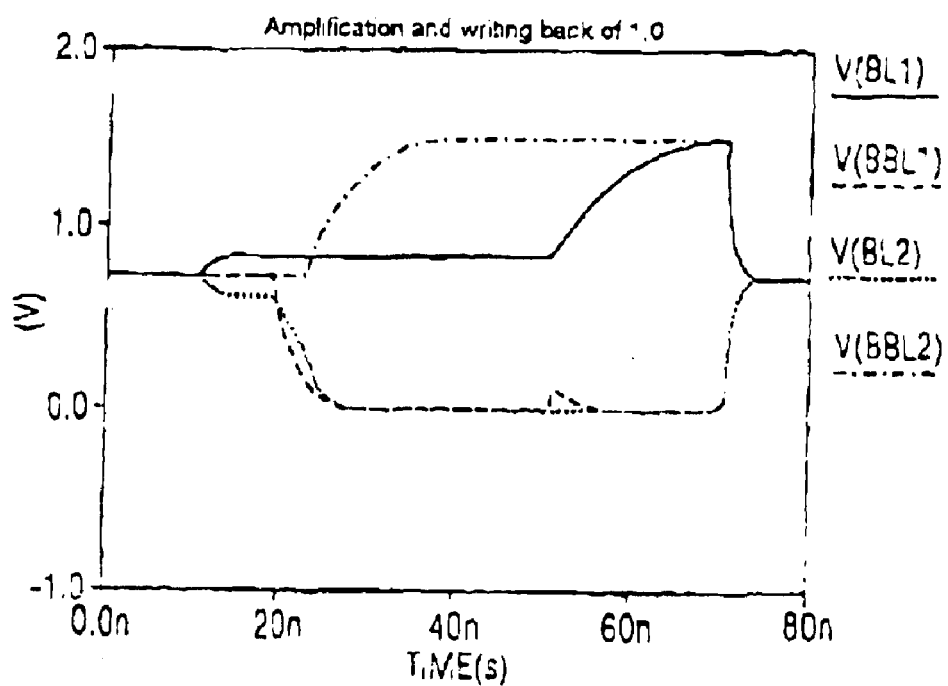

FIGS. 5*a* to 5*c* illustrate voltage profiles for the internal read-out and writing back of information items from/to bit line pair(s) 16 illustrated in FIG. 3, the respective bit line pairs 16 considered being designated by a "1" and a "2".

FIG. 5*a* illustrates the voltage profiles, in each case the information item logic "0" being written to the memory cells 15 to be evaluated in the corresponding bit line pairs 16.

At the beginning of the evaluation method, a reference voltage value is set on all the bit lines 12, 13, said value being 0.75 volt in the present exemplary embodiment. The cell signals of cell 1 and cell 2 are then amplified by the N latch circuits 41, 51 of the first 40 and second 50 read/write amplifier elements. Since the information item logic "0" had originally been written to both cells, the voltage value decreases in the event of activation in comparison with the reference voltage value, this being represented by the slight fall at approximately 10 nsec in FIG. 5*a*. Since both voltage values on the bit lines 12 of the memory cells to be evaluated are somewhat lower than the respective reference voltage values, these voltage values, designated by V(BL1) and V(BL2) in FIG. 5*a*, are pulled to a low potential by means of the N latch circuits 41, 51, said low potential being 0 volts in the present exemplary embodiment. Since the P latch circuit 42 is also activated at the same time in the first read/write amplifier element 4, in this case the higher voltage value of the reference bit line, said value being designated as V(BBL2) in FIG. 5*a*, is amplified to the high level, which is 1.5 volts in the exemplary embodiment. Since the second read/write amplifier element 50 does not contain a P latch circuit, the reference voltage value V(BBL1) is initially present in a substantially unchanged form.

After the information items of the cells connected to the first read/write amplifier element 40 have been read out, evaluated and written back, the bit lines are disconnected by the selection transistors, with the result that they float at full voltage levels. The selection transistors are then changed over in such a way that the still active P latch circuit 42 of the first read/write amplifier element 40 is connected to the second read/write amplifier element 50, or to the bit line pair connected thereto. In this case, the N latch circuit 51 in the second read/write amplifier element 50 is kept active, and the voltages that have hitherto not been amplified, that is to say the reference bit line voltage V(BBL1) in this case, can be amplified to a full high level and subsequently be written back to the cell. In the exemplary embodiment in accordance with FIG. 5*a*, this is done after a time of approximately 50 nsec has elapsed. Once all the cells have been evaluated, the word line 14 is deactivated. By means of the equalizer 43, the reference voltage of 0.75 volt is once again set on all the bit lines, this being the case at approximately 70 nsec in the exemplary embodiment in accordance with FIG. 5*a* and being rendered apparent from the fact that the individual voltage curves converge from the respective full levels to the value of the reference voltage.

FIGS. 5*b* and 5*c* illustrate the voltage profiles for other cell information constellations in each case. FIG. 5*b* considers a situation in which the information item logic "1" had been written to the first cell and the information item logic "0" had been written to the second cell. FIG. 5c illustrates a case in which the information item logic "1" had in each case been written to the two cells to be evaluated. The profile of the respective voltage curves ensues according to the rules described with regard to FIG. 5a. As can be seen from FIGS. 5b and 5c, the voltage value of the bit line to be evaluated increases in comparison with the reference voltage if the information item logic "1" is written to the cell. This then correspondingly affects the amplification of the voltage levels in each case to the high level or to the low level, the respective amplification being effected according to the stipulations mentioned under FIG. 5a.

Finally, FIGS. 6a and 6b illustrate the external reading (FIG. 6a) and the external writing (FIG. 6b) of cell information items of a memory cell on the bit line pair 16 designated by "1" in FIG. 3. In the case of reading, a voltage difference is generated by the read/write amplifier element 50 after activation of the bit switch 54 on the external data lines (MDQ and BMDQ) 31, which voltage difference is identified by the distance d rendered apparent by arrows in FIG. 6a, and can then be evaluated and suitably amplified by the external second read/write amplifier 32.

In the case of writing in accordance with FIG. 6b, voltage levels are applied via the external data lines (MDQ and BMDQ) 31 to the latch circuits of the read/write amplifier elements, which enable these to toggle in the respectively desired direction. FIG. 6b illustrates how, on the bit line pair 1 (see FIG. 3), the cell information item logic "0" is overwritten with an information item logic "1".

What is claimed is:

1. A read/write amplifier for a DRAM memory cell, which, for evaluation of the information content of at least one DRAM memory cell, is connected or can be connected to a plurality of bit lines and to a plurality of reference bit lines, which in each case form a bit line pair, having a number of components for assessment, amplification and forwarding of voltage signals read from the bit lines and reference bit lines, in which case the read/write amplifier has a first read/write amplifier element and a second read/write amplifier element separate therefrom and in that the individual amplifier elements are divided between the two read/write amplifier elements, wherein the first read/write amplifier element is located at a first end of the bit line pairs and the second read/write amplifier element is located at a second end of the bit line pairs, and wherein the bit line pairs are activated or can be activated with the read/write amplifier.

2. The read/write amplifier as claimed in claim 1, wherein the amplifier components have at least one N latch circuit for amplifying a voltage signal to a low level and/or at least one P latch circuit for amplifying a voltage signal to a high level and/or at least one equalizer for producing a reference voltage value on the bit line(s) and the reference bit line(s) and/or at least one bit switch for connecting at least one selected bit line pair to at least one external data line.

3. The read/write amplifier as claimed in claim 2, wherein at least one N latch circuit and at least P latch circuit are provided in the first read/write amplifier element.

4. The read/write amplifier as claimed in claim 2, wherein at least one equalizer is provided in the first read/write amplifier element.

5. The read/write amplifier as claimed in claim 2, wherein at least one N latch circuit is provided in the second read/write amplifier element.

6. The read/write amplifier as claimed in claim 2, wherein at least one bit switch is provided in the second read/write amplifier element.

7. The read/write amplifier as claimed in claim 1, wherein the second read/write amplifier element is connected or can be connected to at least one external data line.

8. The read/write amplifier as claimed in claim 1, wherein the second read/write amplifier element is connected or can be connected to at least one further read/write amplifier.

9. The read/write amplifier as claimed in claim 1, wherein the first and/or second read/write amplifier element(s) has/have one or more transistors for changing over between different bit lines and reference bit lines, respectively.

10. A DRAM memory, having a number of DRAM memory cells, which each form one or more memory cell arrays, each memory cell being connected to a bit line and the bit lines furthermore being connected to at least one read/write amplifier, wherein the at least one read/write amplifier is designed as a read/write amplifier as claimed in claim 1.

11. The DRAM memory as claimed in claim 10, wherein at least one word line is provided, which is routed across the memory cell array(s) and, for activation of the DRAM memory cells, is connected to one or more memory cell(s).

12. The DRAM memory as claimed in claim 10, wherein a plurality of bit lines of a memory cell array are connected to a read/write amplifier.

13. The DRAM memory as claimed in claim 10, wherein in each case a bit line of a DRAM memory cell that is to be evaluated and a reference bit line of a DRAM memory cell that is not to be evaluated form a bit line pair, and in that each bit line pair is connected both to the first and to the second read/write amplifier element.

14. The DRAM memory as claimed in claim 10, wherein the connection of a bit line and/or reference bit line to a read/write amplifier is activated or can be activated via one or more transistors.

15. A method for evaluating DRAM memory cells of a DRAM memory, in particular of a DRAM memory as claimed in claim 10, and in particular using a read/write amplifier as claimed in claim 1, having the following steps:
   a) activation of one or more memory cells that are to be evaluated via at least one word line;
   b) activation of a connection of at least one first bit line pair, formed from a bit line of the memory cell that is to be evaluated and a reference bit line of a memory cell that is not to be evaluated, to a first read/write amplifier element, and activation of the connection of at least one second bit line pair, adjacent to the first bit line pair, to a second read/write amplifier element, the two bit line pairs in each case being connected to the first and second read/write amplifier elements;
   c) amplification of the voltage signals read out via the first bit line pair by means of at least one N latch circuit provided in the first read/write amplifier element and also a P latch circuit, and amplification of the voltage signals read out via the second bit line pair by means of at least one N latch circuit provided in the second read/write amplifier element;
   d) evaluation and writing back of the data of the memory cell(s) that is/are to be evaluated and is/are actively connected to the first read/write amplifier element;
   e) changeover of the connection between the bit line pairs and the first read/write amplifier element in such a way that the P latch circuit of the first read/write amplifier element is changed over to the second read/write amplifier element;
   f) evaluation and writing back of the data of the memory cell(s) that is/are to be evaluated and is/are actively connected to the second read/write amplifier element; and g) deactivation of the memory cells that are to be evaluated.

16. The method as claimed in claim 15, characterized in that, before the evaluation of the memory cells, a uniform reference voltage is applied to all the big lines of the memory cells provided in one or more memory cell array(s).

17. The method as claimed in claim 15, wherein the bit line pair which is actively connected to the first read/write amplifier element is disconnected from the first read/write amplifier element after the end of step d), with the result that the bit line and the reference bit line float with full voltage levels, and in that the N latch circuit of the first read/write amplifier element is subsequently switched off.

18. The method as claimed in claim 15, wherein, after the activation of a bit switch provided in the second read/write amplifier element, a voltage difference is generated on one or more external data line(s) connected to said bit switch.

19. The method as claimed in claim 15, wherein, after the end of the evaluation operation, the uniform reference voltage is applied to all the bit lines of the evaluated memory cells via an equalizer.

* * * * *

UNITED STATES PATENT AND TRADEMARK OFFICE
CERTIFICATE OF CORRECTION

PATENT NO. : 6,768,686 B2 Page 1 of 1
APPLICATION NO. : 10/001429
DATED : July 27, 2004
INVENTOR(S) : Alexander Frey It is certified that error appears in the above-identified patent and that said Letters Patent is hereby corrected as shown below:

On the front page, in field (57) ABSTRACT, line 18, please replace "member" with --memory--

Signed and Sealed this

Ninth Day of January, 2007

JON W. DUDAS
*Director of the United States Patent and Trademark Office*